US007888736B2

(12) United States Patent
Anderson et al.

(10) Patent No.: US 7,888,736 B2
(45) Date of Patent: Feb. 15, 2011

(54) MUGFET WITH OPTIMIZED FILL STRUCTURES

(75) Inventors: Brent Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 676 days.

(21) Appl. No.: 11/846,825

(22) Filed: Aug. 29, 2007

(65) Prior Publication Data

US 2009/0057781 A1 Mar. 5, 2009

(51) Int. Cl.
*H01L 27/12* (2006.01)

(52) U.S. Cl. ........... 257/347; 257/E21.44; 257/E27.112

(58) Field of Classification Search ................. 257/347, 257/368, E21.444, E27.112
See application file for complete search history.

(56) References Cited

U.S. PATENT DOCUMENTS

2004/0195628 A1* 10/2004 Wu et al. .................... 257/351
2006/0275988 A1* 12/2006 Yagishita et al. ............ 438/275
2008/0203540 A1* 8/2008 Anderson et al. ........... 257/629
2008/0283925 A1* 11/2008 Berthold et al. ............. 257/368
2008/0296681 A1* 12/2008 Georgakos et al. .......... 257/347
2009/0050975 A1* 2/2009 Bryant et al. ............... 257/369

* cited by examiner

*Primary Examiner*—Lynne A Gurley
*Assistant Examiner*—Colleen A Matthews
(74) *Attorney, Agent, or Firm*—Gibb I.P. Law Firm, LLC; Richard M. Kotulak, Esq.

(57) ABSTRACT

A semiconductor structure includes active multi-gate fin-type field effect transistor (MUGFET) structures and inactive MUGFET fill structures between the active MUGFET structures. The active MUGFET structures comprise transistors that change conductivity depending upon voltages within gates of the active MUGFET structures. Conversely, the inactive MUGFET fill structures comprise passive devices that do not change conductivity irrespective of voltages within gates of the inactive MUGFET fill structures. The gates of the active MUGFET structures are parallel to the gates of the inactive MUGFET fill structures, and the fins of the active MUGFET structures are the same size as the fins of the inactive MUGFET fill structures. The active MUGFET structures have the same pitch as the gates of the inactive MUGFET fill structures. The gates of the active MUGFET structures comprise active doping agents, but the inactive MUGFET fill structures do not contain the active doping agents.

2 Claims, 2 Drawing Sheets

Fill Structures 200

Standard Transistor Structures 102

Fill Structures 200

MUGFET WITH OPTIMIZED FILL STRUCTURES

BACKGROUND AND SUMMARY

The embodiments of the invention generally relate to fill structures and more particularly to a semiconductor structure that includes active multi-gate fin-type field effect transistor (MUGFET) structures and inactive MUGFET fill structures between the active MUGFET structures.

Uniformity is becoming more and more critical as lithography is severely challenged and other processes such at anneals become shorter and shorter which result in local non-uniformities. Fill structures in these advanced regimes need to be modified to have a robust process window and still perform multi-faceted functions.

Fill structures today look significantly different than standard devices. Fill structures are primarily used to adjust for density issues and so the shape, orientation, etc. of fill structures have not been optimized to be consistent with the rest of the process. This idea presented herein is to make the fill follow the rules of these advanced devices so that the uniformity to all aspects of the process are optimized. This can have advantages at mask making, lithography, etch, data prep, etc.

In order to address such issues, the present invention provides a semiconductor structure that includes active multi-gate fin-type field effect transistor (MUGFET) structures and inactive MUGFET fill structures between the active MUGFET structures.

The active MUGFET structures comprise transistors that change conductivity depending upon voltages within gates of the active MUGFET structures. Conversely, the inactive MUGFET fill structures comprise passive devices that do not change conductivity irrespective of voltages within gates of the inactive MUGFET fill structures. The gates of the active MUGFET structures are parallel to the gates of the inactive MUGFET fill structures, and the fins of the active MUGFET structures are the same size as the fins of the inactive MUGFET fill structures. The gates of the active MUGFET structures have the same pitch as the gates of the inactive MUGFET fill structures. The active MUGFET structures comprise active doping agents, but the inactive MUGFET fill structures do not contain the active doping agents.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
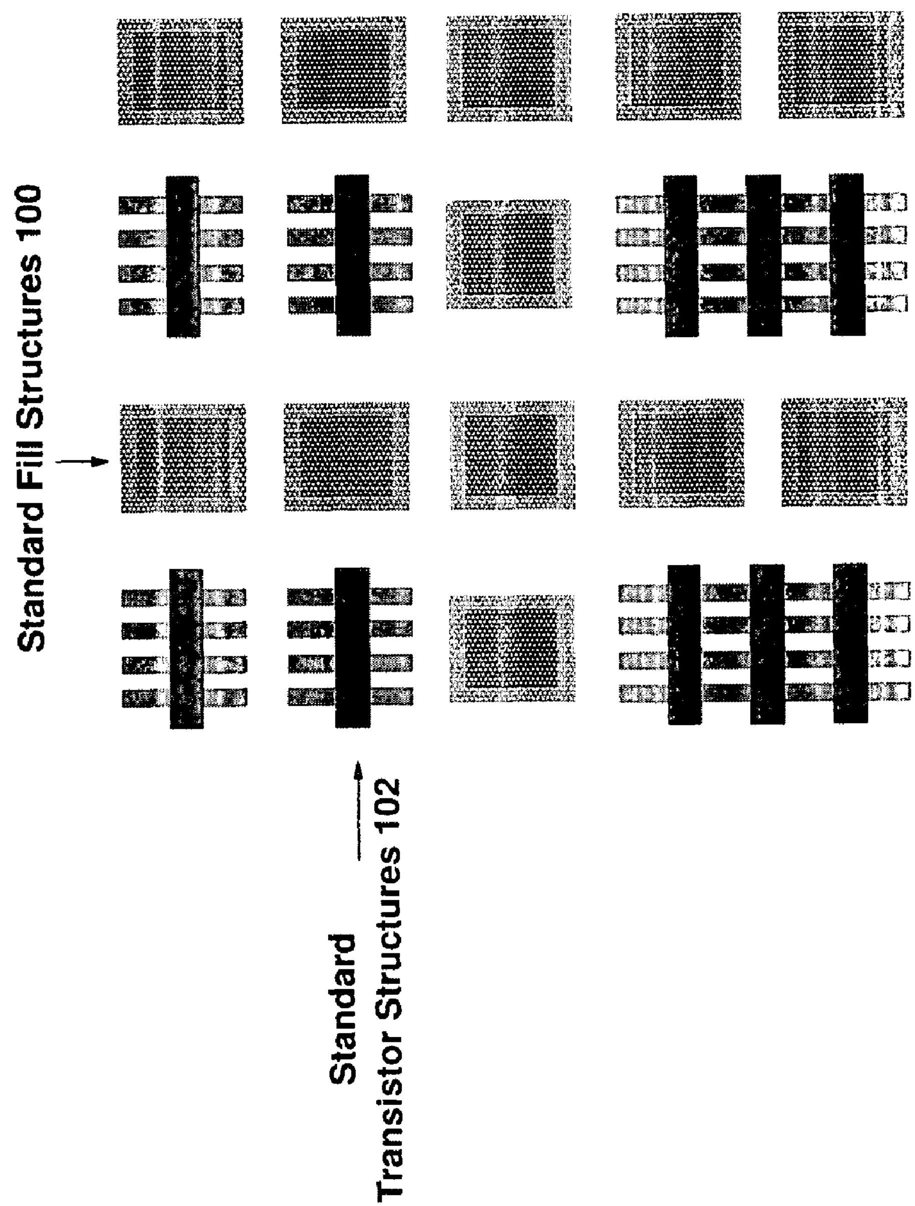
FIG. 1 is a schematic diagram of a semiconductor having conventional fill structures.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above and as shown in FIG. 1, conventional fill structures 100 look significantly different than standard devices 102. Fill structures are primarily used to adjust for density issues and so the shape, orientation, etc. of fill structures have not been optimized to be consistent with the rest of the process. This idea presented herein is to make the fill structures follow the rules of these advanced devices so that the uniformity to all aspects of the process are optimized. This can have advantages at mask making, lithography, etch, data prep, etc.

Figure 2:
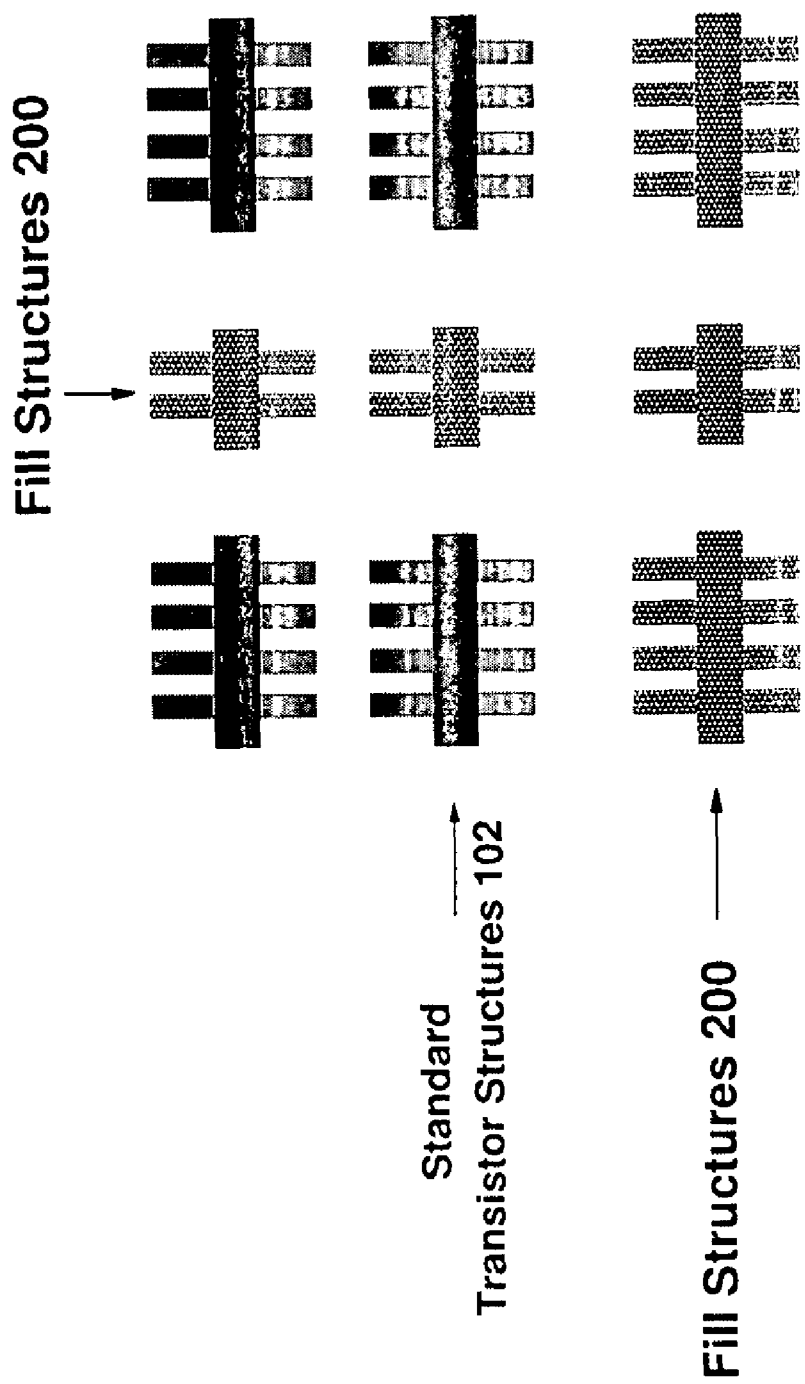
FIG. 2 is a schematic diagram of a semiconductor having fill structures according to embodiments herein.

In order to address such issues, as shown in FIG. 2, the present invention provides a semiconductor structure that includes active multi-gate fin-type field effect transistor (MUGFET) structures 102 and inactive MUGFET fill structures between the active MUGFET structures 200.

The active MUGFET structures 102 comprise transistors that change conductivity depending upon voltages within gates of the active MUGFET structures 102. Conversely, the inactive MUGFET fill structures 200 comprise passive devices that do not change conductivity irrespective of voltages within gates of the inactive MUGFET fill structures 200. The gates of the active MUGFET structures 102 are parallel to the gates of the inactive MUGFET fill structures 200, and the fins of the active MUGFET structures 102 are the same size as the fins of the inactive MUGFET fill structures 200. The gates of the active MUGFET structures 102 have the same pitch as the gates of the inactive MUGFET fill structures 200. The gates of the active MUGFET structures 102 comprise active doping agents, but the inactive MUGFET fill structures 200 do not contain the active doping agents.

Multi-Gate device fill can be optimized to enhance lithography, etch, and thermal processing by utilizing FINs and small gate structures for the fill. Orientation of the fill and gates is optimized when it is kept consistent with the active devices. Spacing to active devices is typically kept larger and fill structures can be excluded from implants to increase Rs, lower capacitance, etc.

Some aspects of this are: same inactive gate orientation as standard devices, inactive gate size being similar to active gate, inactive gate on similar pitch to standard gate active region, (RX) size similar to standard MUGFET size, same RX orientation as standard devices, and some fill devices can optionally be used for later design changes.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A semiconductor structure comprising:

active multi-gate fin-type field effect transistor (MUGFET) structures; and inactive MUGFET fill structures between said active MUGFET structures, wherein said gates of said active MUGFET structures are parallel to said gates of said inactive MUGFET fill structures, and wherein said gates of said active MUGFET structures have a same pitch as said gates of said inactive MUGFET fill structures.

2. A semiconductor structure comprising:

active multi-gate fin-type field effect transistor (MUGFET) structures; and inactive MUGFET fill structures between said active MUGFET structures, wherein said gates of said active MUGFET structures have a same pitch as said gates of said inactive MUGFET fill structures, wherein said gates of said active MUGFET structures are parallel to said gates of said inactive MUGFET fill structures, and wherein fins of said active MUGFET structures are a same size as fins of said inactive MUGFET fill structures.

* * * * *